(12) United States Patent
Sørensen et al.

(10) Patent No.: US 6,840,776 B2
(45) Date of Patent: Jan. 11, 2005

(54) ADAPTER FOR A LIGHT SOURCE

(75) Inventors: Nicolaj Sørensen, Holte (DK); Thomas Harrit, Holte (DK)

(73) Assignees: Katholm Invest A/S, Kobenhavn (DK); Kai Rostrup Jensen ApS, Struer (DK)

( * ) Notice: Subject to any disclaimer, the term of this patent is extended or adjusted under 35 U.S.C. 154(b) by 0 days.

(21) Appl. No.: 10/097,246

(22) Filed: Mar. 15, 2002

(65) Prior Publication Data

US 2003/0032337 A1 Feb. 13, 2003

(30) Foreign Application Priority Data

Aug. 13, 2001 (DK) ......................................... 2001 01213
Nov. 19, 2001 (DK) ......................................... 2001 01720

(51) Int. Cl.[7] .............................................. H01R 12/00
(52) U.S. Cl. ..................................... 439/56; 439/699.2
(58) Field of Search ............................... 439/699.2, 56, 439/619, 557, 57; 362/800, 487, 226, 238, 89; 257/98–100; 361/773, 768; 385/147; 313/31; 240/52.1, 152

(56) References Cited

U.S. PATENT DOCUMENTS 2,847,560 A  *  8/1958  Peak et al. ................. 339/126
3,314,042 A  *  4/1967  Gabrielian ................. 339/126
4,667,270 A     5/1987  Yagi
5,427,532 A  *  6/1995  Owen et al. .................. 439/57
5,612,855 A     3/1997  Heeb et al.
5,727,310 A  *  3/1998  Casson et al. ................ 29/830

FOREIGN PATENT DOCUMENTS

| EP | 0955623 | 11/1999 |
| GB | 2180996 | 4/1997 |
| WO | WO 96/13866 | 9/1996 |
| WO | WO 00/13469 | 3/2000 |

* cited by examiner

Primary Examiner—Alex Gilman
(74) Attorney, Agent, or Firm—James Creighton Wray; Meera P. Narasimhan

(57) ABSTRACT

An adapter for at least one light emitter for mounting in a aperture in a sandwich board comprising a core of electrically insulating material, the core being provided with a layer of electrically conducting material at each side of the core, where the aperture is continuing at least partly through the sandwich board, the adapter comprising one or more first pins that are adapted for establishing electrically conducting connection with one of the layers when mounting the adapter in the aperture, and at least one second pin adapted for establishing electrically conducting connection with the other layer when mounting the adapter in the aperture.

8 Claims, 10 Drawing Sheets

US 6,840,776 B2

ADAPTER FOR A LIGHT SOURCE

This application claims the benefit of Danish Application No. 2001 01213 filed Aug. 13, 2001 and Danish Application No. PA 2001 01720 filed Nov. 19, 2001.

BACKGROUND OF THE INVENTION

The present invention concerns an adapter for a light emitter for mounting in a aperture in a sandwich board and use of such adapter for forming a desired image.

It is common to make light displays where a number of light emitters are mounted on the display. The light emitters are disposed so that they form the shape or the text to be shown by the display. The light emitters are supplied with electric voltage with a number of wires as each single light emitter has to be individually connected with a power supply. The number of wires may therefore be great, implying a relatively high production price and difficulties in making thin displays.

Alternatively, the displays are made with light conductors connected with one or more external light emitters. With this type of displays, a large number of light emitters are to be used, causing the same disadvantages as mentioned above.

SUMMARY OF THE INVENTION

The object of the invention is to provide an easy way of mounting and servicing light emitters mounted in one plane, to reduce the need for wiring and to facilitate the making of thin displays.

This object is achieved by providing an adapter for at least one light emitter for mounting in a aperture in a sandwich board comprising a core of electrically insulating material, the core being provided with a layer of electrically conducting material at each side of the core, where the aperture is continuing at least partly through the sandwich board, the adapter comprising one or more first pins that are adapted for establishing electrically conducting connection with one of the layers when mounting the adapter in the aperture, and at least one second pin adapted for establishing electrically conducting connection with the other layer when mounting the adapter in the aperture.

By using the adapter according to the invention, several light emitters may be mounted in arbitrary patterns on a sandwich board. This only requires that the sandwich board is provided with apertures at the positions where light emitters are desired to be placed. The sandwich board may be cut to the shape desired. The sandwich board may be plane, or it may be shaped, e.g. by twisting or bending. The light emitters are lit by applying a voltage suitable for the light emitters on the conducting layers of the sandwich board.

By using the adapter according to the invention, the sandwich board may be used for displays but may also be used for lighting. A sandwich board may e.g. be suspended in the ceiling as a "starry sky".

BRIEF DESCRIPTION OF THE DRAWINGS

In the following, the invention will be described in more details with reference to Figures, wherein.

DETAILED DESCRIPTION OF THE PREFERRED EMBODIMENTS

On the Figures, the light emitter is a diode, why the first leg is designated anode pin and the other pin is designated cathode pin. The use of diodes is particularly suitable when using low voltage and low power. The light emitter may also be an incandescent bulb, a possibly formed or bent neon tube, an aggregation of several diodes, or another known electric light emitter. The adapter may also include other electronics than a diode. There may e.g. be mounted a resistor before the diode or other electronics for protecting the diode against overvoltage or for controlling the current of the diode in other ways. The indicated adapter may also be used for other electric devices, e.g. a motor.

Figure 1:
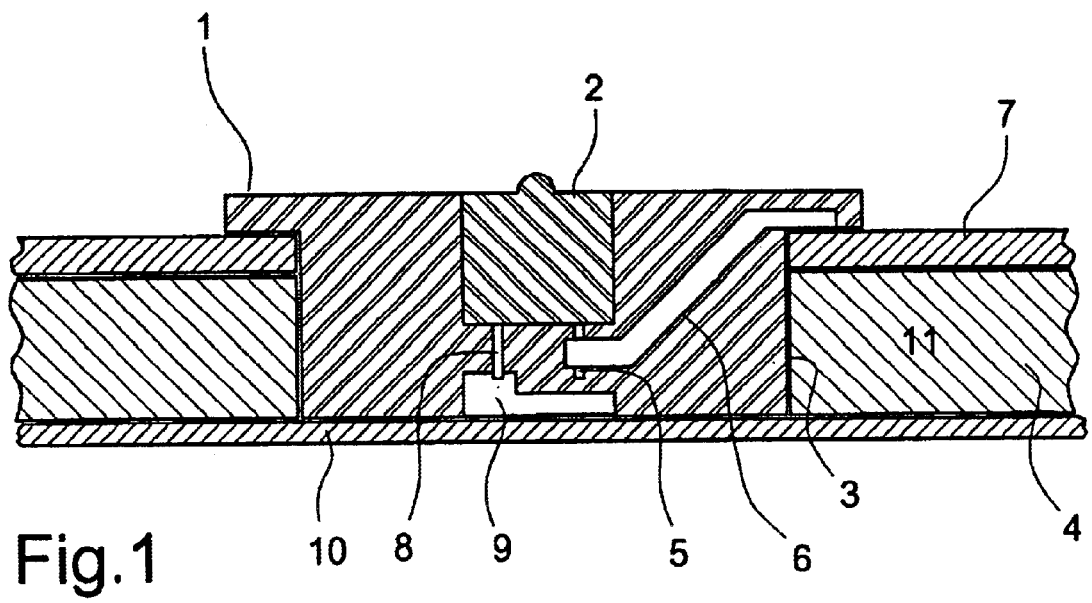
FIG. 1 shows a cross-section of a first embodiment of the adapter according to the invention mounted on a sandwich board.

On FIG. 1 is shown the adapter 1 in which the light emitter, here a diode 2, is fastened. The adapter 1 is mounted in a milled or drilled aperture 3 in the sandwich board 4. The aperture 3 may be provided in other ways than by cutting operation, e.g. by a combination of punching and injection molding or thermoforming of the individual layers. The anode terminal 5 of the diode is connected to a first end of an anode pin 6, and the cathode terminal 8 of the diode is connected to a first end of a cathode pin 9. The second end of the anode pin is in electrical connection with a first layer 7 of electrically conducting material of the display, and the second end of the cathode pin 9 is in electrical connection with a second layer 10 of electrically conducting material of the display 10.

It is also possible to mount the diode with opposite polarity so that anode and cathode pins exchange their function. Several adapters may be mounted with different polarity in the same sandwich board. Hereby the diodes may be controlled as two distinct groups. This enables letting the two groups flash or turning on both groups by applying AC voltage with low and high frequency, respectively, turning on one or the other group depending on the polarity of the applied voltage, or by having different luminous intensity in the two groups by varying the pulse width in the supplied AC voltage.

The adapter 1 and the diode 2 may be produced as an integrated unit, or the diode may be fastened in the adapter 1 by commonly known techniques, e.g. bonding, soldering or interference fit. The electrical connection between the diode 2 and the anode pin 6 and the cathode 9 may be achieved with commonly know techniques, e.g. bonding, soldering or interference fit. In the shown embodiment, the adapter 1 is fastened with interference fit, whereby the anode pin 6 and the cathode pin 9 are pressed into the layers 7, 10 of electrically conducting material. The adapter 1 may be fastened in the milled aperture or cavity 3 with known methods, e.g. interference fit, bonding or with an overlying plastic film. Fastening by plastic film, which preferably is transparent, provides for ready access for dismounting and possible substituting a light emitter. As the plastic film also protects against exposure to moisture, the use of plastic film may take place even if the adapter 1 is fastened in the milled aperture 3 with another kind of technique. Alternatively, the adapter may be protected against moisture with lacquer or other coating.

The sandwich board 4, which consists of two layers 7,10 of electrically conducting material and a core 11 of electrically insulating material, is prior art. The electrical insulator 11 may e.g. consist of polyethylene, PVC or nylon in a thickness of 4–25 mm. The layers 7,10 may e.g. consist of aluminum, copper, silver or gold with a thickness of 0.5 to 10 mm. With dimensions in the proposed ranges it will be possible to provide light diodes in 500 adapters in a board of one square meter. The insulator 11 as well as the layers of electrically conducting material 7,10 may also consist of a transparent material, being an advantage when viewing the sandwich board from behind.

Figure 2:
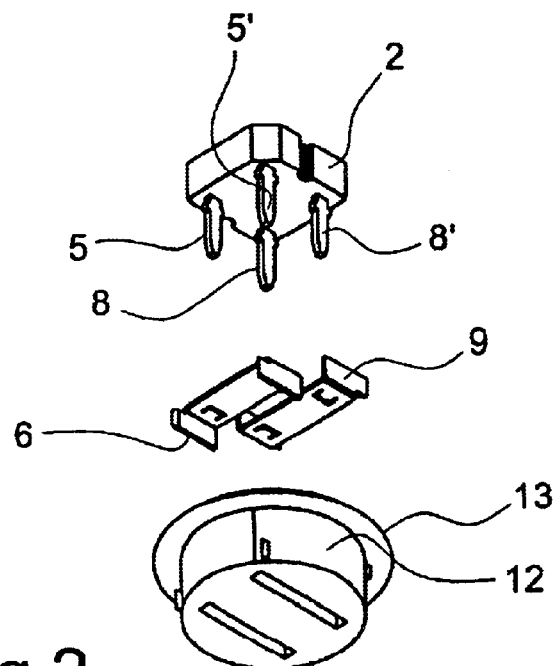
FIG. 2 shows a second embodiment of the adapter according to the invention in an exploded perspective view.

On FIG. 2 is shows a second embodiment of the adapter, where the individual parts of the adapter are shown separately together with a diode. At the top is seen the diode 2 with the anode terminals 5,5' and the cathode terminals 8,8', which by assembling establishes electrical connection with the anode pins 6 and the cathode pins 9 and is surrounded by the adapter casing 12. The anode pins 6 and the cathode pins 9 may advantageously be molded together with the adapter casing 12. The adapter casing 12 is provided with a collar 13 which may comprise means for securing against moisture intrusion, e.g. an O-ring or other sealing.

Figure 3:
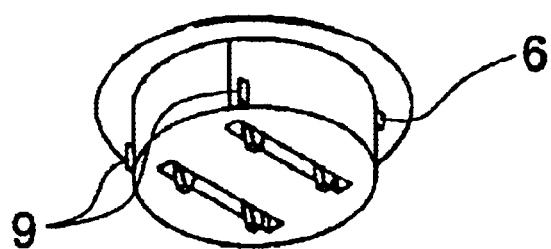
FIG. 3 shows a perspective view of the adapter of FIG. 2, but in assembled state.

On FIG. 3, the adapter 1 is seen from below. In this embodiment, the diameter of the adapter casing 12 is about 13 mm, and the diameter of the collar 13 is about 16 mm, but other dimensions are possible depending on the particular diode to be used with the adapter. The part of the anode pin 6 and the cathode pin 9 protruding out of the adapter housing will, by mounting in a milled aperture in a sandwich board, become pressed into the electrically conducting layer of the sandwich board and thereby establish electric connection therewith.

Figure 4:
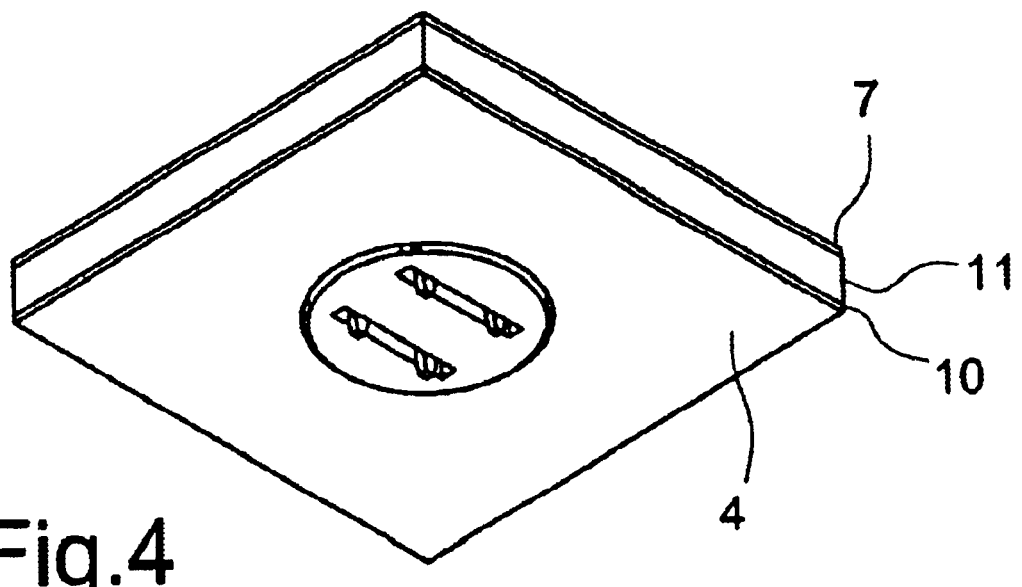
FIG. 4 shows the adapter of FIG. 2 mounted in a sandwich board in a perspective view from below.

On FIG. 4 is seen the adapter 1 mounted in a sandwich board 4. In the shown embodiment, the milled aperture is made through the entire thickness of the sandwich board. The cathode pin 9 is pressed into one layer 10 of electrically conducting material. The insulator 11 as well as the layers of electrically conducting material 7,10 may also consist of a transparent material, being an advantage when viewing the sandwich board from behind. In a further embodiment according to the invention, the adapter is adapted for mounting two oppositely directed light emitters. Hereby light emitters are disposed on both sides of the adapter so that light is provided on both sides of the sandwich board, thus improving the possibility of utilizing both sides of the sandwich board for illumination or signaling.

Figure 5:
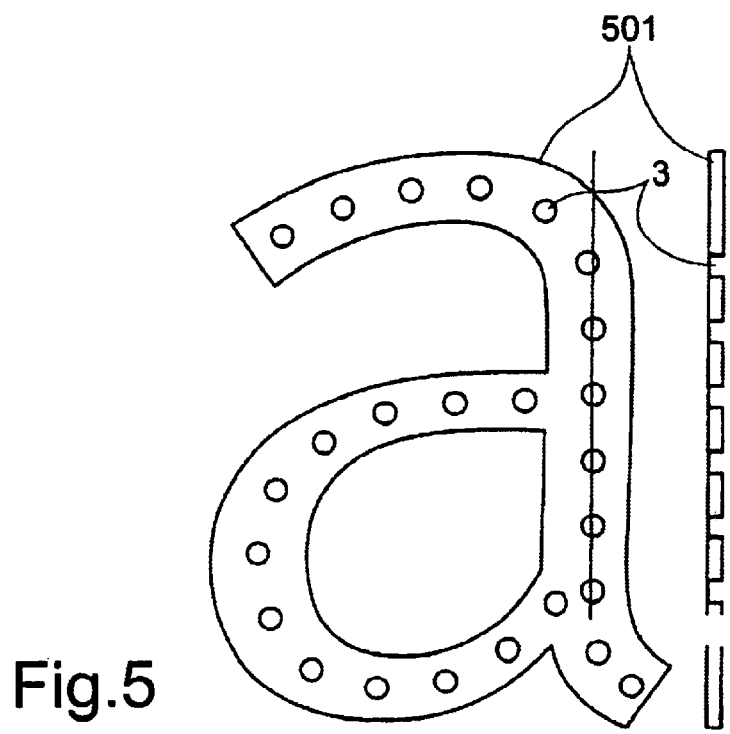
FIG. 5 shows front and a sectional views of a sandwich board with apertures for a plurality of adapters.

On FIG. 5 is seen a display 501 comprising a sandwich board with millings for several adapters seen from the front and in section. The display 501 is shaped as the symbol to be signified by the display, and the display 501 is provided with evenly distributed millings 3 for mounting adapters according to the invention. As superfluous material has been removed from the display, low weight is achieved. Furthermore, the display may be read in full daylight as the reading is not dependent on the light emitters.

Figure 6:
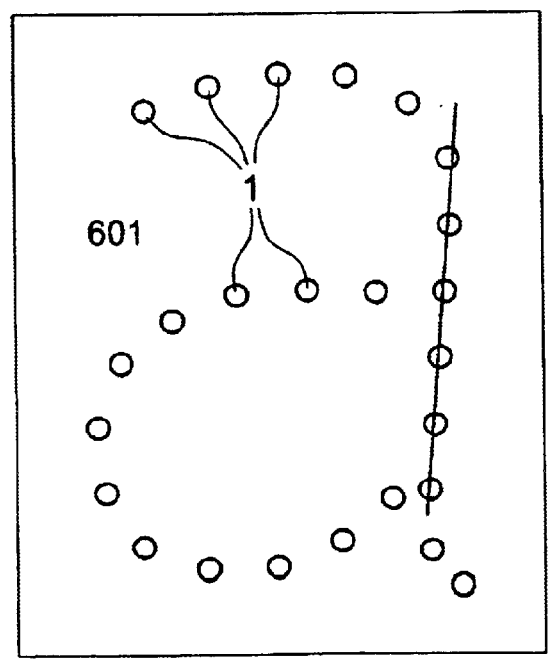
FIG. 6 shows a further sandwich board with apertures for a plurality of adapters.

On FIG. 6 is seen a rectangular display 601 in which a number of adapters 1 are fitted in a pattern defining the sign of the display. This embodiment is simple to suspend as several signs may be provided on the same board. Furthermore, it is easy to produce as the board is not to be cut in the shape of the sign.

Figure 7:
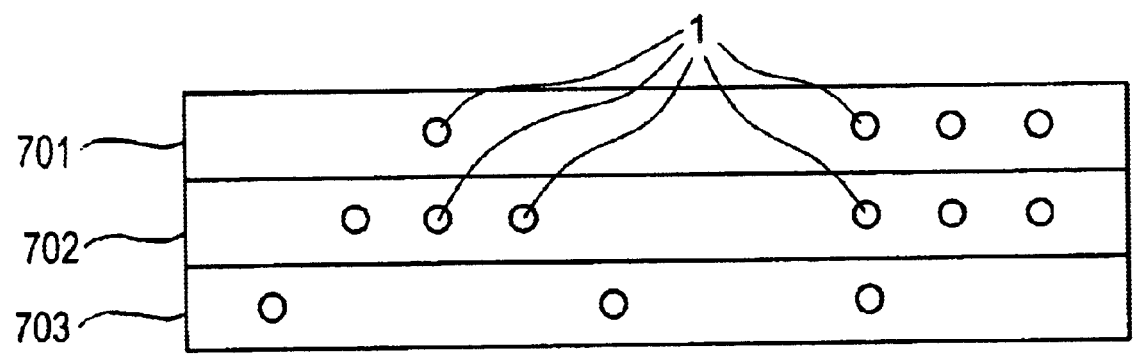
FIG. 7 shows plural adapters mounted on a still further sandwich board composed of plural, electrically separate segments.

On FIG. 7 is seen an embodiment of the invention where a number of adapters 1 are inserted in a sandwich board, where one layer of electrically conducting material is divided into a number of mutually electrically insulating segments 701,702,703. Hereby, light emitters in the sandwich board may be turned on and off separately for each segment. This provides possibility for different kinds of running lights. The same effect may be achieved by mounting another embodiment of the adapter in a sandwich board with additional electrically insulated cores and additional layers of electrically conducting material. This embodiment comprises different adapters with anode pins and cathode pins placed so that they by mounting establishes electric connection with different layers. By combining the said alternatives for dividing the sockets into groups, complicated patterns may be achieved.

Figure 17:
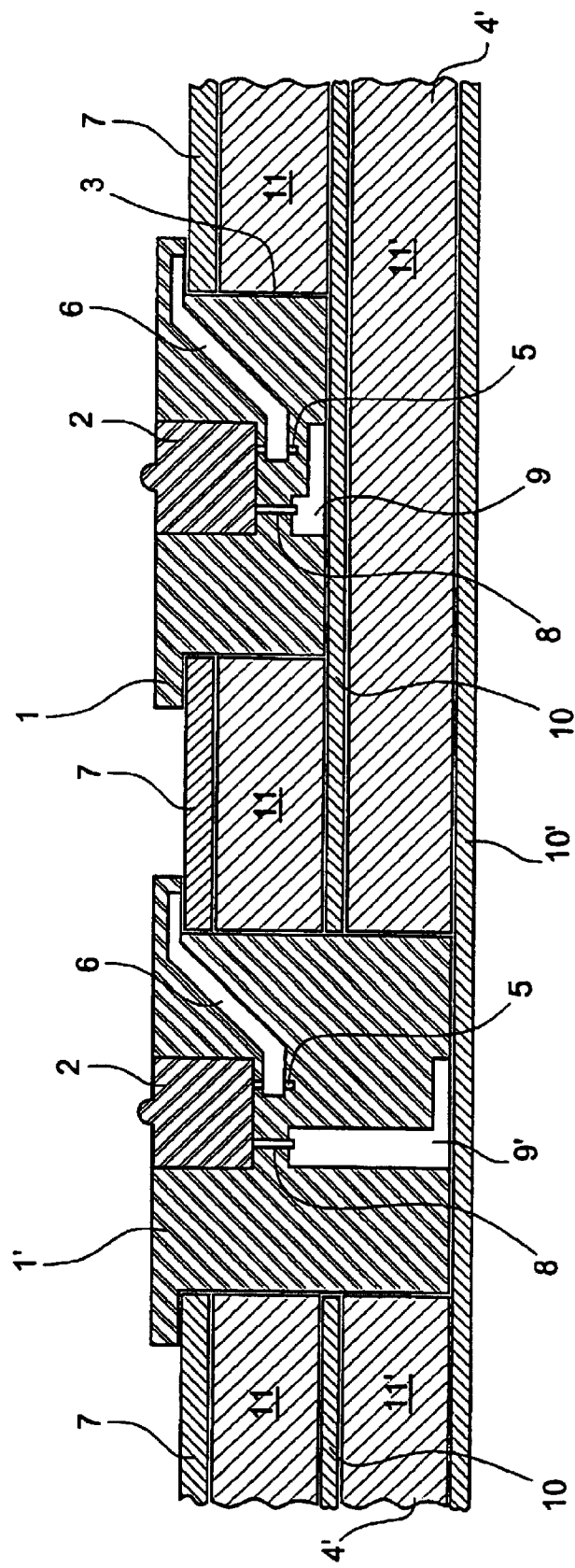
FIG. 17 shows the embodiment of FIG. 1 mounted in a sandwich board with an additional conductive layer.

FIG. 17 shows an adapter 1 mounted in a sandwich board 4' with an additional conductive layer 10' and an additional insulated core 11. Another adapter 1' is mounted in the same sandwich board 4'. The cathode pin 9' of the adapter 1' has established electrical connection with the additional conductive layer 10'.

Figure 8:
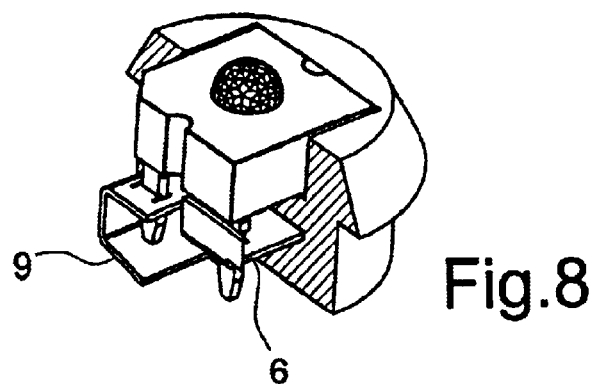
FIG. 8 shows a section of a third embodiment of the adapter according to the invention in perspective view.
Figure 9:
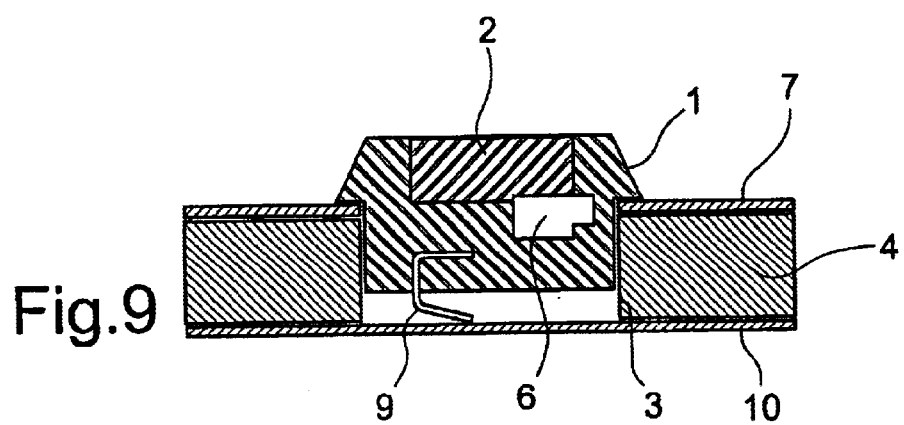
FIG. 9 shows the embodiment of FIG. 8 mounted in a sandwich board in cross-section.
Figures 10, 11:
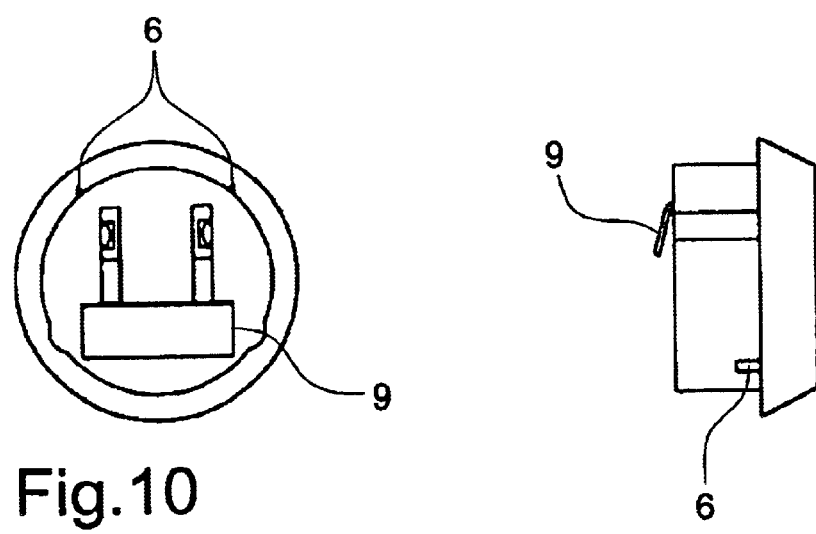
FIG. 10 shows the embodiment of FIG. 8 as seen from below.
FIG. 11 shows the embodiment of FIG. 8 from the side.

FIG. 8 shows a third embodiment of the adapter 1 for mounting in an aperture which does not go quite through the sandwich board. The cathode pin 9 is designed so that it by insertion into the board becomes bent and hereby establishes good electrical connection with one layer of electrically conducting material. FIG. 9 shows the same adapter in a blind hole 3 in the sandwich board. The cathode pin 9 is bent so that the electrical connection with one layer of electrically conducting material 10 is established by means of the spring force coming from elastic deformation of the cathode pin 9. On FIG. 10 the adapter is seen from below, the anode pin 6 providing electrical contact with one layer of the conducting material 7 by the anode pin 6 being pressed into the edge of the electrically conducting material 7 at the mounting of the adapter. On FIG. 11, the adapter is seen from the side where the level difference between the anode pin 6 and the cathode pin 9 is clearly seen. By using this embodiment, safety against moisture intrusion from one side is obtained, and since one layer of the sandwich board is kept in one continuous piece, the board will remain stable, even in case of many apertures.

Figure 12:
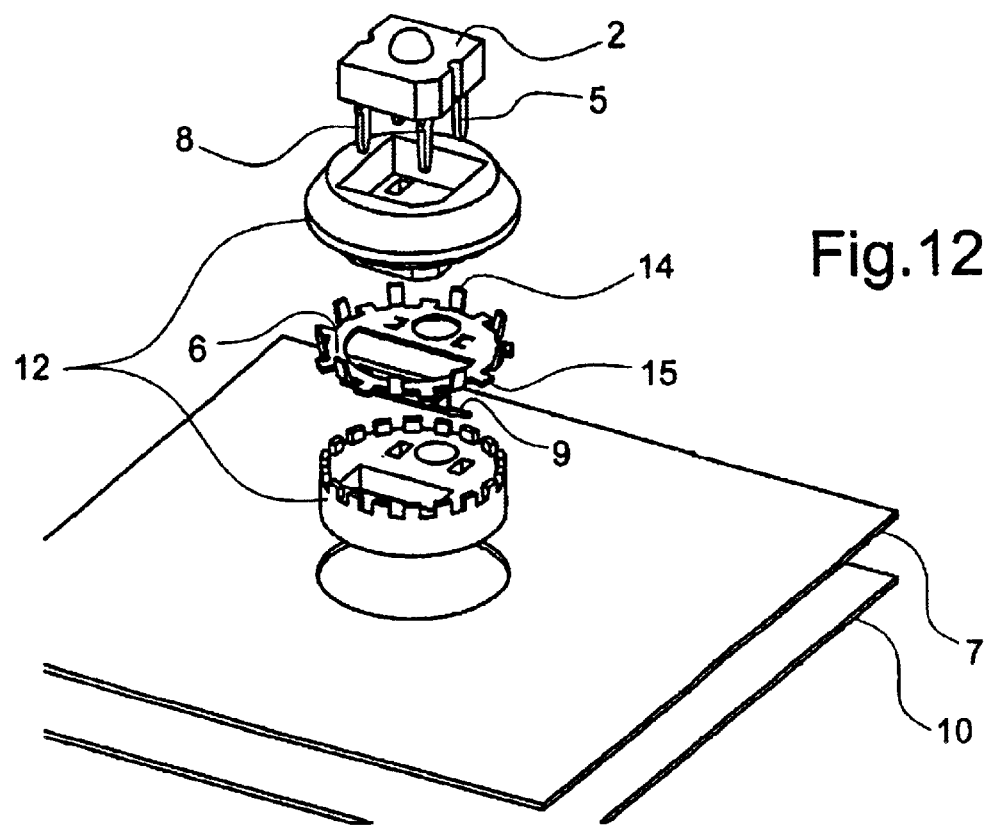
FIG. 12 shows a fourth embodiment of the adapter according to the invention in exploded, perspective view.
Figure 13:
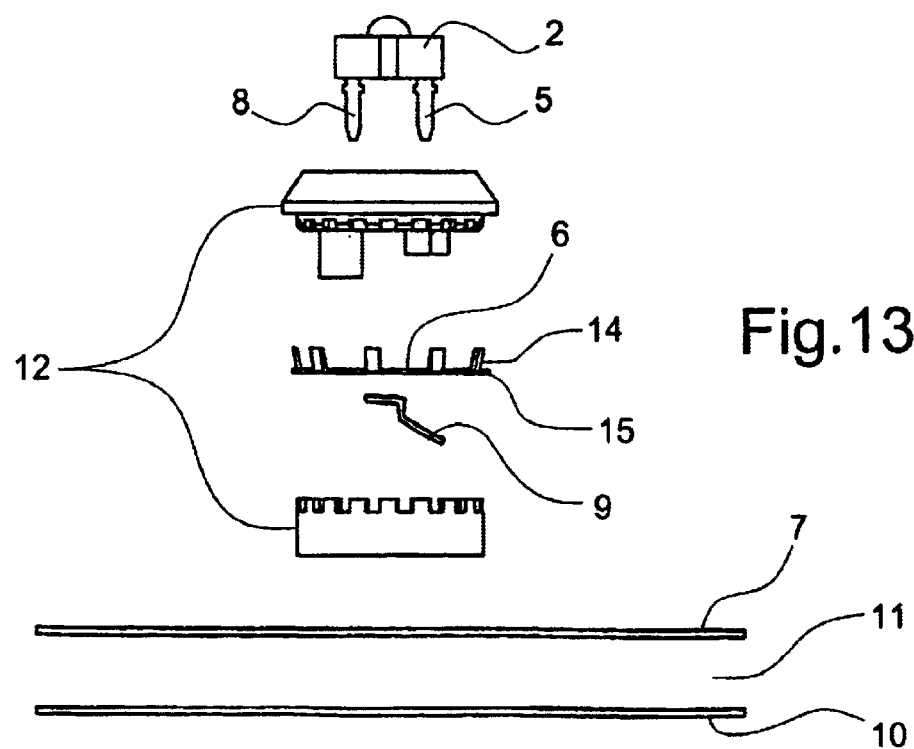
FIG. 13 shows the same as FIG. 12, but in a side view.

FIGS. 12 and 13 show a fourth embodiment of the adapter according to the invention. The adapter casing 12 is here composed of an upper and a lower part with the anode pin 6 between the upper and lower part of the adapter casing. The upper part is provided with two guide pins fitting into guide holes in the lower part. The anode pin 6 is made as a disc with guide holes allowing passage of guide pins of the upper part of the casing and holding the anode pin in a correct position with a socket for establishing electrical connection with the anode terminal 5 of the diode 2, and a number of turned up pins 14 for establishing electrical connection between the anode pin 6 and one layer 7 of electrically conducting material. By using several pins, a better and more stable electrical connection between the anode pin 6 and one electrically conducting layer 7 is achieved. The anode pin 6 is furthermore provided with a number of flat retainer pins 15 acting as barbs. During mounting in the sandwich board, these pins 15 are thus slightly bent and are pressed a little into the insulating core 11. The retainer pins 15 will therefore hold the adapter in the sandwich plate. The cathode pin 9 is provided with sockets for establishing electrical connections with the cathode terminal 8 of the diode 2. In the mounted state, the cathode pin 9 will establish electrical connection with the second electrically conducting layer 10.

Figure 14:
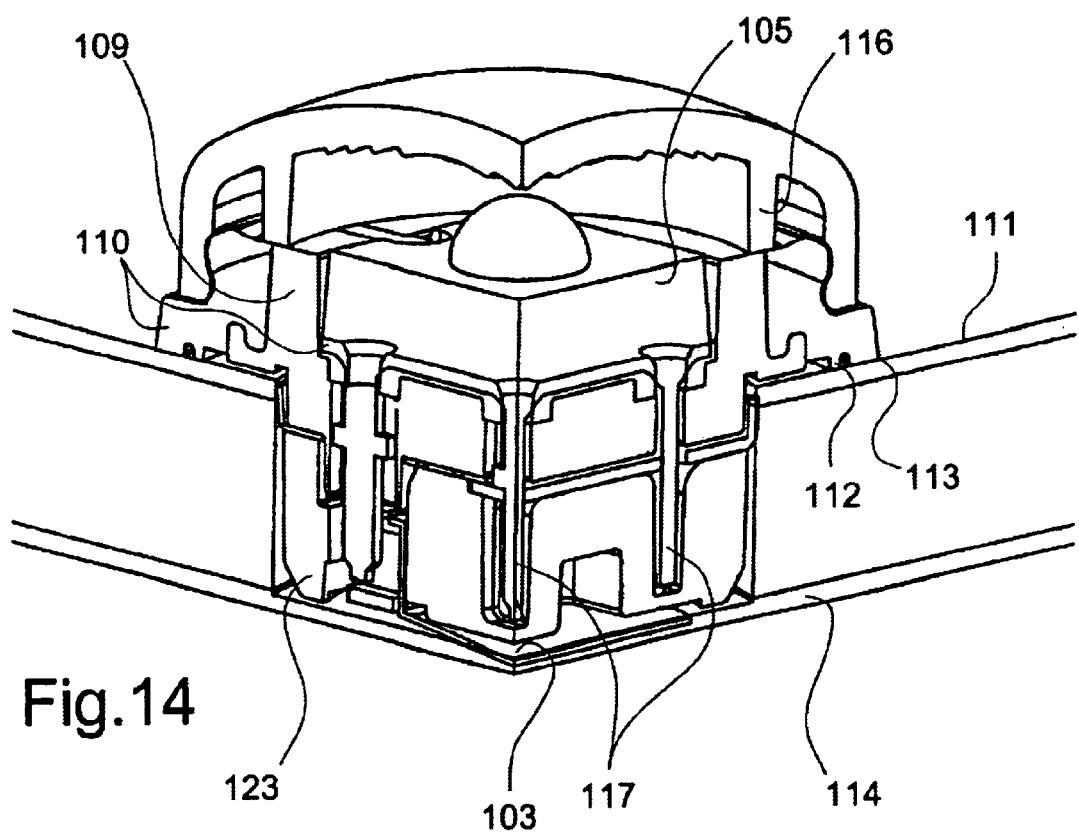
FIG. 14 shows a fifth embodiment of the adapter according to the invention mounted in a sandwich board in a sectional, perspective view.
Figure 15:
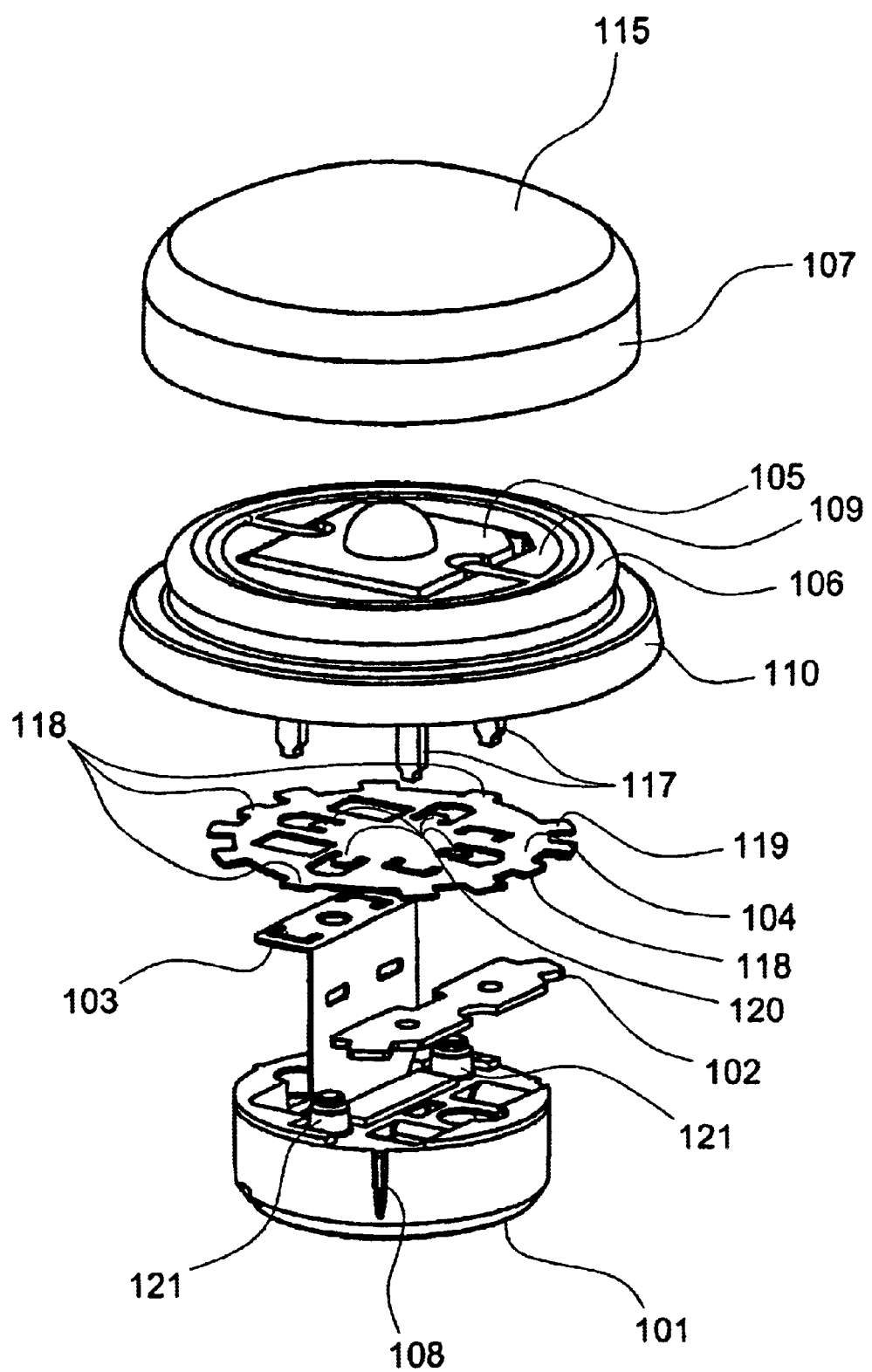
FIG. 15 shows the adapter of FIG. 14 in a partly exploded, perspective view from above.
Figure 16:
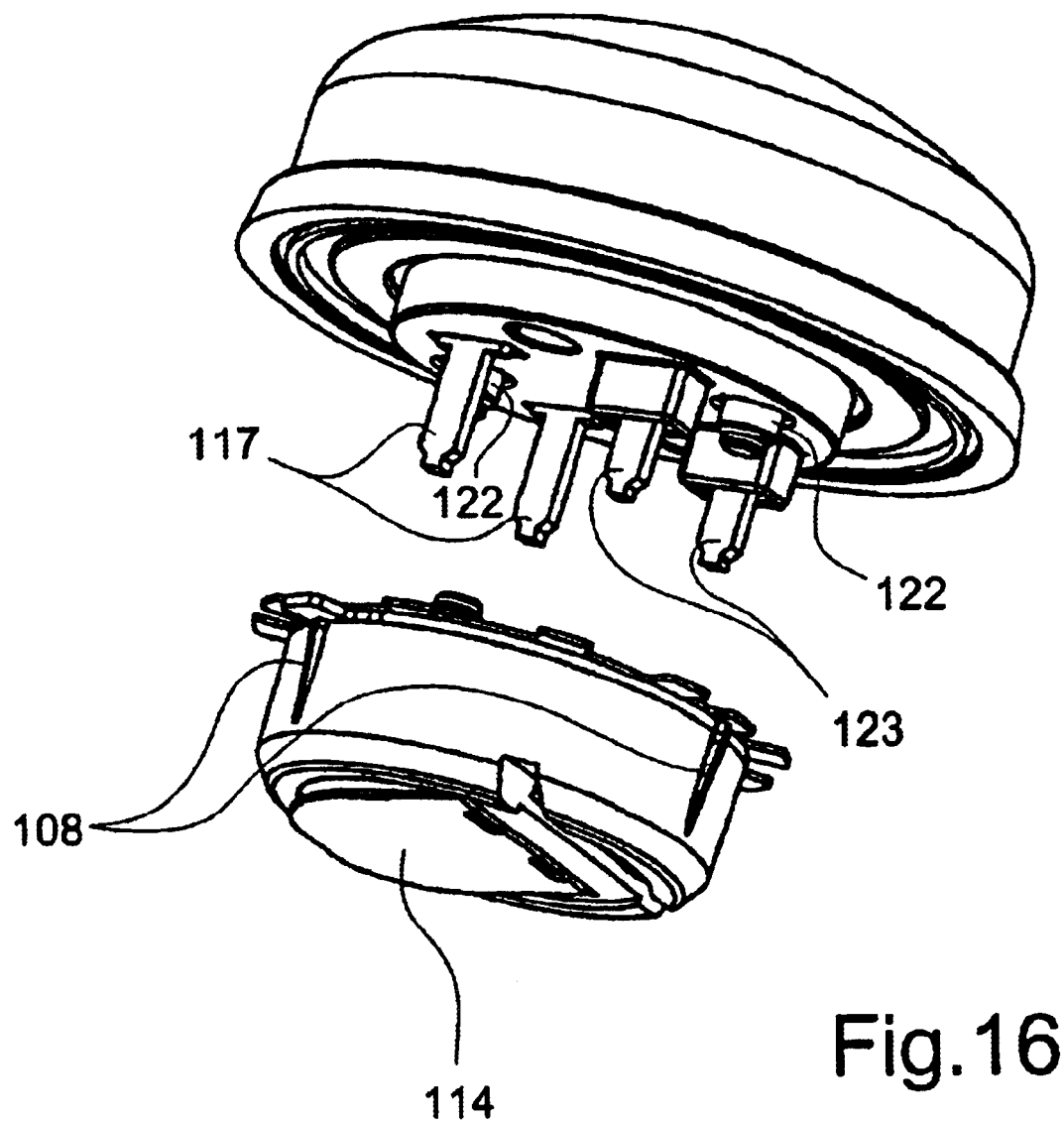
FIG. 16 shows the adapter of FIG. 14 partly assembled in two parts in a perspective view from below.

The fifth embodiment of the adapter shown in FIGS. 14–16 is described in detail below.

The bearing principle of the construction is that the electric connections for a large number of light diodes go through two aluminum layers at front and rear sides, respectively, of an aluminum/PVC laminate or sandwich board, which is henceforth called the composite, and that this composite is the main component in a flat display structure which can be tailor made, put up and operated reliably everywhere, inter alia on building fronts outside.

With this embodiment, the following advantages are achieved:

The adapter may be mounted and fixed in the composite in a simple and secure way.

Separation with the purpose of recycling the raw materials of the device is possible.

The aluminum sheets at the front and rear sides of the composite function as conductors for electrical currents for the cathode and anode pins, respectively. The front side also functions as a cooling panel for the power losses in the light diodes.

In connection with application of the lighting system, the composite may be worked on usually occurring production equipment at display makers focusing on aluminum as raw material.

Electric and thermal contact is formed by items being pressed together or shaped into each other.

The construction functions inside and outside in all weather and in ambient temperatures between −20° C. and +45° C.

The contacts are protected against corrosion, inter alia by the whole construction being sealed toward the surroundings in order to prevent moisture to come in.

Long service life is ensured, and unnecessary heating of the diode is avoided by designing the adapter so that the thermal resistance from the cathode pins to the surroundings is far less that the maximum allowable figure of 90 K/W.

The adapter is not to be oriented in specific directions in the hole in the composite.

The same construction is used whether directing the light forwards and backwards.

A mechanical interlocking of the component parts of the adapter is established before it is mounted in the composite.

The diodes mounted are protected against mechanical damage and UV-light during storage and transport.

Environmentally friendly materials are used as much as possible.

Component Parts:

The construction consists of three plastic items, three metal items, one diode and specification of the holes in the composite to be used in mounting the adapter. See FIGS. 14–16.

The plastic items are:

Bottom: The bottom 101 fits with the hard part 109 of the top 106. The bottom 101 constitutes the first item in the mounting sequence, and all three metal items 102,103, 104 are mounted on the item before the top 106 is pressed on, after which the assembly constitutes the basic adapter. Later on, the diode 105 and the hat 107 are pressed on. In order to center the adapter in the hole in the composite, three guides 108 are provided along the edge of the item.

Top (two-component item): The top 106 consists of a hard 109 and a soft plastic part 110, which are molded together. The purpose of the soft part or seal is to prevent moisture to penetrate into the metallic contacts of the adapter. This forms sealing abutting against the hat 107, against the front side of the composite 111 and against the underside of the diode 105. The sealings against the underside of the diode 105 and against the hat 107 together form a double barrier between the metal contacts 101, 103 and the surroundings. The sealing against the front side of the composite is by itself a double barrier with a thin inner wall 112 and a thicker outer wall 113. These two double barriers are disposed in parallel in the construction. The soft part 110 consists of a non-conducting material in order thereby to avoid galvanic corrosion against the front side of the composite. The assembled and fitted adapter ensures that the bottom spring 103 presses against the inner side 114 of the rearmost aluminum sheet and that the four diode pins may be pressed through the star 104, the heat conductor 102 and the bottom spring 103 in one working operation.

Hat (lens): The hat 107 functions both as sealing member and as optical diffuser. The hat is mounted on the soft part 110 of the top, thereby providing good sealing towards the surroundings. The optics 115 dissipates the light for better distribution and thereby achieving a uniform light level on the viewed surfaces. The hat furthermore has the property that the material absorbs UV light and thereby protects the diode against UV irradiation. When the adapter is pressed into the composite, forces are transmitted from the hat 107 to the hard part 109 of the top via a built-in cylinder 116 in order not to damage or deform the soft part of the top. If there is no use for the extra dispersion of light, and if the construction is placed within a dry environment, the hat may be done without when the final display product is put up and ready for operation.

The metal items are:

Star:

The star 104 in made in zinced stainless steel with three functions:

1. To secure the assembled adapter in the composite by means of 4 flaps 118. The flaps have a length resulting in that they by mounting of the adapter in the composite are positioned under the aluminum sheet at the front side 111 of the composite.
2. To provide electrical contact between the cathode pins 117 of the diode and the aluminum sheet at the front of the composite by means of eight flaps 119. These eight flaps 119 also act as barbs together with the four previously mentioned flaps 118, and in this way they contribute to holding the adapter fast in the composite.
3. To lock the two plastic items top 106 and bottom 101 together. With this function, snap locks or welding with ultrasound is avoided. In assembling, the flaps will grip around the towers 121 in the bottom and 122 in the top and hereby keep the adapter in assembled state.

Heat Conductor 102:

The heat conductor 102 is made in aluminum for conducting heat from the cathode pins 117 to the aluminum sheet at the front side 111 of the composite. The cathode pins are pressed through two holes in the heat conductor 102, whereby the holes approximately gets the same shape as the diode pins. A heat conducting paste is used for providing good thermal conductivity and for protecting against galvanic corrosion between silver and aluminum.

Bottom Spring:

The bottom spring 103 in stainless steel is to provide electrical connection from the anode pins to the aluminum sheet at the rear side 114 of the composite. It is noted that there is no need for removing heat from the anode pins.

In the bottom spring and in the star, the same spring principle is used for hooking the items fast on the diode pins and for creating good electric contact.

The diode is used to some extent as construction element, as both star and bottom spring are hooking on the pins and thereby contribute to locking the members of the adapter together. Assembled adapters without diodes may, however, without any problems be packed and shipped to retailers that want to mount the diodes in their own workshops.

The composite is one of the basic elements in the construction. Holes with diameter 12 mm are milled for mounting the adapters. Furthermore, the outer contour of the display characters are milled so that the composite in this way is constituting the load-bearing construction and shape of the display. Constructional details in connection with the wiring for the power supply is to be placed at the same side of the composite as the adapters, and they should not be visible from the edge of the display.

Cooling of the Diode Chip.

The heat from the diode chip is conducted away through the two cathode pins 117. The thermal resistance from the chip to the soldering points of the pins is maximum 90 K/W according to the Vishay data sheet for TELUX™ diodes. An object of the adapter construction is to establish a thermal resistance from the soldering points to the surroundings which is as small as possible. The resistance is to be 90 K/W at the most; however, the lower maximum temperature of the chip during operation, the longer the service life of the product.

The star 104 of stainless steel is not sufficiently effective as heat conductor and cannot fulfill the requirement for low thermal resistance by itself. Therefore, an item 102 of aluminum only having the purpose of conducting heat away from the cathode pins 117 is inserted. Furthermore, heat conducting paste is used in the contact areas in order thereby to increase heat dissipation. Calculations show that the thermal resistance from the pins to the surrounding in this way becomes as low as about 40 K/W. Measurements on hand samples of the construction have shown a resistance of about 50 K/W.

Corrosion

The construction consists inter alia of different conducting materials that are put together for establishing reliable electrical connections. Of the other materials used, some may possibly present a risk over time for establishing unwanted electrical connections or contacts.

Through the lifetime of the product, the conductivity of the contacts may be influenced by corrosion coming from the action of gases and moisture. If moisture is present at the points of contact, galvanic corrosion will occur, and this mechanism presents far the greatest risk for functional failure of the product.

In order to prevent moisture from penetrating into the contact points, soft sealings 110 are made around the whole adapter construction. These seals may, however, not provide complete security against moisture penetrating in over time, and therefore the construction is made with the following details in the solution:

The points of contact between the silverplated cathode pins and the items in stainless steel and aluminum have been applied a heat conducting and water repelling paste. It has three functions: Increasing the heat conductivity, protection against corrosion from the air and protection against galvanic corrosion caused by moisture.

The stainless steel items are zinced, and thereby the risk of galvanic corrosion between the contacts of these items and the aluminum sheets of the composite is reduced. Furthermore, the contact surfaces are applied a water repelling agent, e.g. silicone compound or grease for preventing air and water from producing corrosion.

Between the anode pins 123 and the stainless bottom spring 103, nothing special have been done, as stainless steel and silver are not mutually aggressive. The contact point between the bottom spring and the aluminum sheet of the composite is sealed with a water repelling agent, e.g. silicone or grease.

Over time, moisture may penetrate in through the plastic member of the composite or in under the aluminum sheets bonded thereon. In this way, moisture may get access to the contacts of the adapter. Protection of the contact areas with moisture repelling agents may therefore be enhanced by the following measures:

Bonding a soft seal at the front side of the composite

Bonding a soft seal on the hat

Filling all cavities and contact areas with non-conducting and non-hardening silicone compound.

What is claimed is:

1. An adapter for a sandwich board, comprising a sandwich board having a central insulating layer, an upper conducting layer on the insulating layer, and a lower conducting layer under the insulating layer, the adapter having a casing having upper and lower parts of the casing, guide holes in one of the parts, guide pins in the other of the parts fitting into the guide holes, a conducting disc between the upper and lower part, the conducting disc further comprising guide holes allowing passage of the guide pins and holding the conducting disc in correct position between the upper and lower parts, the conducting disc having several outward extending first pins for establishing stable electrical connection with the upper conducting layer, and a second pin mounted in the lower part and extending outward for establishing electrical connection with the lower layer.

2. The adapter of claim 1 for at least one light emitter for mounting in a aperture in a sandwich board comprising a core of electrically insulating material, the core being provided with a layer of electrically conducting material at each side of the core, where the aperture is continuing at least partly through the sandwich board, the adapter comprising one or more first pins that are adapted for establishing electrically conducting connection with one of the layers when mounting the adapter in the aperture, and at least one second pin adapted for establishing electrically conducting connection with the other layer when mounting the adapter in the aperture.

3. An adapter according to claim 1 wherein the light emitter is at least one diode.

4. The adapter of claim 1 further comprising a light-emitting diode having a cathode terminal and an anode terminal extending from the diode, wherein the upper part has a recess for receiving the light-emitting diode, wherein the second pin has a cathode socket for receiving and establishing electrical contact with the cathode terminal, and wherein the conducting disc has an anode socket for receiving and establishing electrical contact with the anode terminal.

5. Use of an adapter as claimed in claim 1 for at least one light emitter for mounting in a aperture in a sandwich board comprising a core of electrically insulating material, the core being provided with a layer of electrically conducting material at each side of the core, where the aperture is continuing at least partly through the sandwich board, the adapter comprising one or more first pins that are adapted for establishing electrically conducting connection with one of the layers when mounting the adapter in the aperture, and at least one second pin adapted for establishing electrically conducting connection with the other layer when mounting the adapter in the aperture.

6. Use of an adapter according to claim 5 wherein the electrical connections are established by interference fit.

7. Use of an adapter according to claim 5 wherein at least one layer of the layers of electrically conducting material is divided into plural mutually electrically insulated segments.

8. Use of an adapter according to claim 5 wherein the adapter is held fixed in the sandwich board by an interference fit.

* * * * *